(12) United States Patent
Ibok et al.

(10) Patent No.: US 6,630,383 B1
(45) Date of Patent: Oct. 7, 2003

(54) BI-LAYER FLOATING GATE FOR IMPROVED WORK FUNCTION BETWEEN FLOATING GATE AND A HIGH-K DIELECTRIC LAYER

(75) Inventors: Effiong Ibok, Sunnyvale, CA (US); Wei Zheng, Santa Clara, CA (US); Nicholas H. Tripsas, San Jose, CA (US); Mark T. Ramsbey, Sunnyvale, CA (US); Fred T K Cheung, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/274,063

(22) Filed: Oct. 17, 2002

Related U.S. Application Data

(60) Provisional application No. 60/412,739, filed on Sep. 23, 2002.

(51) Int. Cl.$^7$ .............................................. H01L 21/336
(52) U.S. Cl. ..................... 438/264; 438/261; 438/594; 257/321; 257/407
(58) Field of Search ................................ 438/261, 264, 438/591, 593, 594, FOR 203; 257/321, 407

(56) References Cited

U.S. PATENT DOCUMENTS

| 5,384,272 | A | | 1/1995 | Ibok et al. ..................... 437/43 |
|---|---|---|---|---|
| 5,422,291 | A | * | 6/1995 | Clementi et al. ............ 438/591 |
| 5,460,992 | A | | 10/1995 | Hasegawa ..................... 437/43 |
| 5,567,638 | A | * | 10/1996 | Lin et al. ..................... 438/592 |
| 5,949,103 | A | | 9/1999 | Lee ................................ 257/321 |
| 6,281,559 | B1 | | 8/2001 | Yu et al. ..................... 257/407 |
| 6,337,246 | B1 | | 1/2002 | Sobek et al. ................ 438/264 |
| 6,362,045 | B1 | * | 3/2002 | Lin et al. ..................... 438/257 |
| 6,369,421 | B1 | | 4/2002 | Xiang et al. ................ 257/321 |

* cited by examiner

Primary Examiner—George Fourson
Assistant Examiner—Thanh V Pham
(74) Attorney, Agent, or Firm—Renner, Otto, Boisselle & Sklar, LLP

(57) ABSTRACT

In one embodiment, a method of making a gate stack semiconductor device is disclosed. The method comprises the steps of: forming a tunnel oxide layer over a p-type semiconductor substrate; forming a floating gate over the tunnel oxide layer by first forming an n-type polysilicon layer and subjecting the n-type polysilicon layer to nitridation, and then forming a p-type polysilicon layer over the nitridated n-type polysilicon layer; and forming a high-K insulating layer over the p-type polysilicon layer.

21 Claims, 4 Drawing Sheets

BI-LAYER FLOATING GATE FOR IMPROVED WORK FUNCTION BETWEEN FLOATING GATE AND A HIGH-K DIELECTRIC LAYER

RELATED APPLICATION DATA

This application claims priority to previously filed U.S. Provisional Application No. 60/412,739, filed on Sep. 23, 2002, entitled "Bi-Layer Floating Gate for Improved Work Function Between Floating Gate and a High-K Dielectric Layer", which is hereby incorporated herein by reference in its entirety.

FIELD OF THE INVENTION

The present invention relates to semiconductor devices such as non-volatile memory devices and to methods for their fabrication, and more particularly to memory devices which incorporate therein a bi-layer floating gate which comprises an n-type polysilicon layer and a p-type polysilicon layer.

BACKGROUND OF THE INVENTION

A continuing trend in semiconductor technology is to build integrated circuits with more and/or faster semiconductor devices. The drive toward this ultra large-scale integration (ULSI) has resulted in continued shrinking of devices and circuit features. As the devices and features shrink, new problems are discovered that require new methods of fabrication and/or new arrangements.

FIG. 1 is cross-section view of a MOSFET transistor 100 having a gate stack. The MOSFET 100 of FIG. 1 includes therein any suitable semiconductor substrate 102 having therein a source region 104 and a drain region 106. The gate stack formed on substrate 102 contains a tunnel oxide layer 108 formed from, for example, silicon dioxide, a floating gate 110 formed from polysilicon, an insulating layer 112 formed from a suitable high-K material and a control gate 114 formed from polysilicon. In the MOSFET 100, the substrate 102 is a p-type substrate, the source 104 and drain 106 are n-type, and the floating gate 110 is an n-type floating gate.

When the MOSFET 100 has a structure as discussed above, the work function between the high-K insulating layer 112 and the floating gate layer 110 can be mismatched depending upon the material utilized to form the high-K insulating layer 112. Accordingly, in order to minimize the mismatched work function between the floating gate 110 and the high-K insulating layer 112, the MOSFET 100 must be fabricated with one of a select few high-K materials. This does not permit the formation of the most efficient MOSFET devices. Additionally, a mismatched work function between the floating gate and the high-K insulating layer can hinder the electron transport potential between the floating gate and the tunnel oxide layer.

Hence, there is a need in the art for a structure which overcomes the aforementioned problems and yields an improved gate stack for semiconductor devices.

SUMMARY OF THE INVENTION

In one embodiment, the present invention relates to a method of making a gate stack semiconductor device comprising the steps of: forming a tunnel oxide layer over a p-type semiconductor substrate; forming a floating gate over the tunnel oxide layer by first forming an n-type polysilicon layer and subjecting the n-type polysilicon layer to nitridation, and then forming a p-type polysilicon layer over the nitridated n-type polysilicon layer; and forming a high-K insulating layer over the p-type polysilicon layer.

In another embodiment, the present invention relates to a method of making a gate stack semiconductor device comprising the steps of: forming a tunnel oxide layer over a p-type semiconductor substrate; forming a floating gate over the tunnel oxide layer by first forming an n-type polysilicon layer and subjecting the n-type polysilicon layer to nitridation, and then forming a p-type polysilicon layer over the nitridated n-type polysilicon layer, wherein the thickness of the p-type polysilicon layer is in the range of about 250 Angstroms to about 550 Angstroms; and forming a high-K insulating layer over the p-type polysilicon layer.

In another embodiment, the present invention relates to a semiconductor device having a gate stack structure, the device comprising: a semiconductor substrate, wherein the semiconductor substrate is a p-type semiconductor substrate; a tunnel oxide layer formed over the semiconductor substrate; a floating gate formed over the tunnel oxide layer; the floating gate comprising: an n-type polysilicon layer formed over the tunnel oxide layer, the n-type polysilicon layer having a nitridated portion opposite the tunnel oxide layer, and a p-type polysilicon layer over the nitridated portion of the n-type polysilicon layer; and a high-K insulating layer formed over the p-type polysilicon layer of the floating gate.

Thus, the present invention overcomes the problems associated with mismatched work functions associated with the gate stacks which contain a high-K insulating layer and an n-type floating gate.

DETAILED DESCRIPTION

Figure 1:
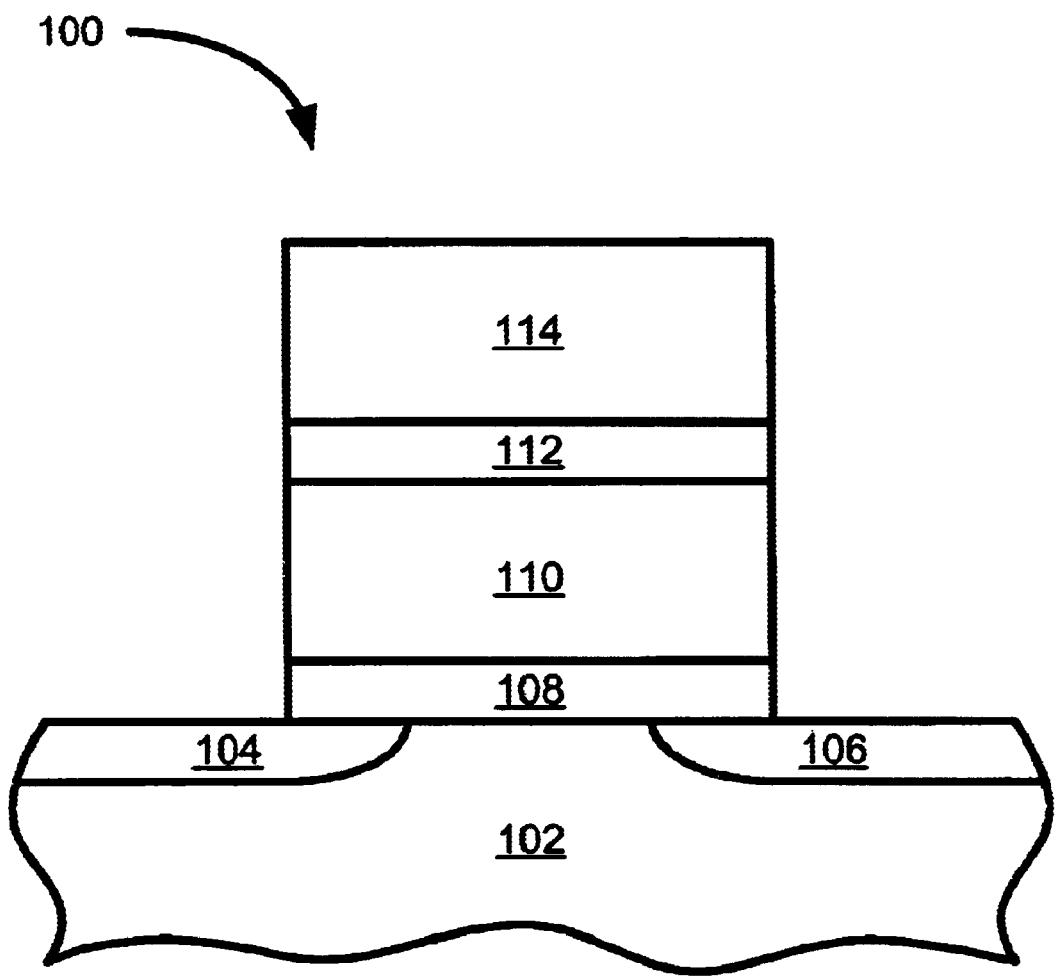
FIG. 1 is a schematic cross-sectional view of a standard MOSFET transistor.

As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_o$) that is $K=\epsilon/\epsilon_o$. High-K materials will be described in greater detail below. Although other materials can be selected for incorporation into the structure of the present invention, suitable materials include oxides, silicates or silicon oxynitrides of Hf, Zr, Ce, Al, Ti and/or Y. Some suitable examples of these compounds include, but are not limited to, aluminum oxide ($Al_2O_3$), hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST). In addition, all binary and ternary metal oxides and ferroelectric materials having a K higher than, in one embodiment, about twenty (20), can be used in the present invention.

As used herein, the term "standard-K dielectric material" or "standard-K dielectric material" refers to a dielectric material having a relative permittivity, or K, of up to about ten (10). Standard-K materials include, for example, silicon dioxide (K of about 3.9), silicon oxynitride (K of about 4 to 8 depending on the relative content of oxygen and nitrogen) and silicon nitride (K of about 6 to 9).

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE 1

| Dielectric Material | Approximate Relative Permittivity (K) |
|---|---|
| aluminum oxide ($Al_2O_3$) | 9 to 12 |
| zirconium silicate | 12 |
| hafnium silicate | 15 |
| hafnium silicon oxynitride | 16 |
| hafnium silicon nitride | 18 |
| lanthanum oxide ($La_2O_3$) | 20 to 30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35 to 75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20 to ~200 |
| barium strontium oxide ($Ba_{1-x}Sr_xO_3$) | ~20 to ~200 |
| $PbTiO_3$ | ~20 to ~200 |
| barium titanate ($BaTiO_3$) | ~20 to ~200 |
| strontium titanate ($SrTiO_3$) | ~20 to ~200 |
| $PbZrO_3$ | ~20 to ~200 |
| PST ($PbSc_xTa_{1-x}O_3$) | 3000 |
| PZN ($PbZn_xNb_{1-x}O_3$) | ~500 to ~5000 |
| PZT ($PbZr_xTi_{1-x}O_3$) | ~150 to ~1000 |
| PMN ($PbMg_xNb_{1-x}O_3$) | ~500 to ~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Semiconductor Devices

The process of the present invention is described herein below in terms of a MOSFET transistor formed on a silicon substrate. It should be noted however, that the present invention can be applied to any device which presently contains an n-type polysilicon layer with a high-K layer formed on the n-type polysilicon layer. Such devices include not only memory devices, but other semiconductor devices as well.

Figure 2:
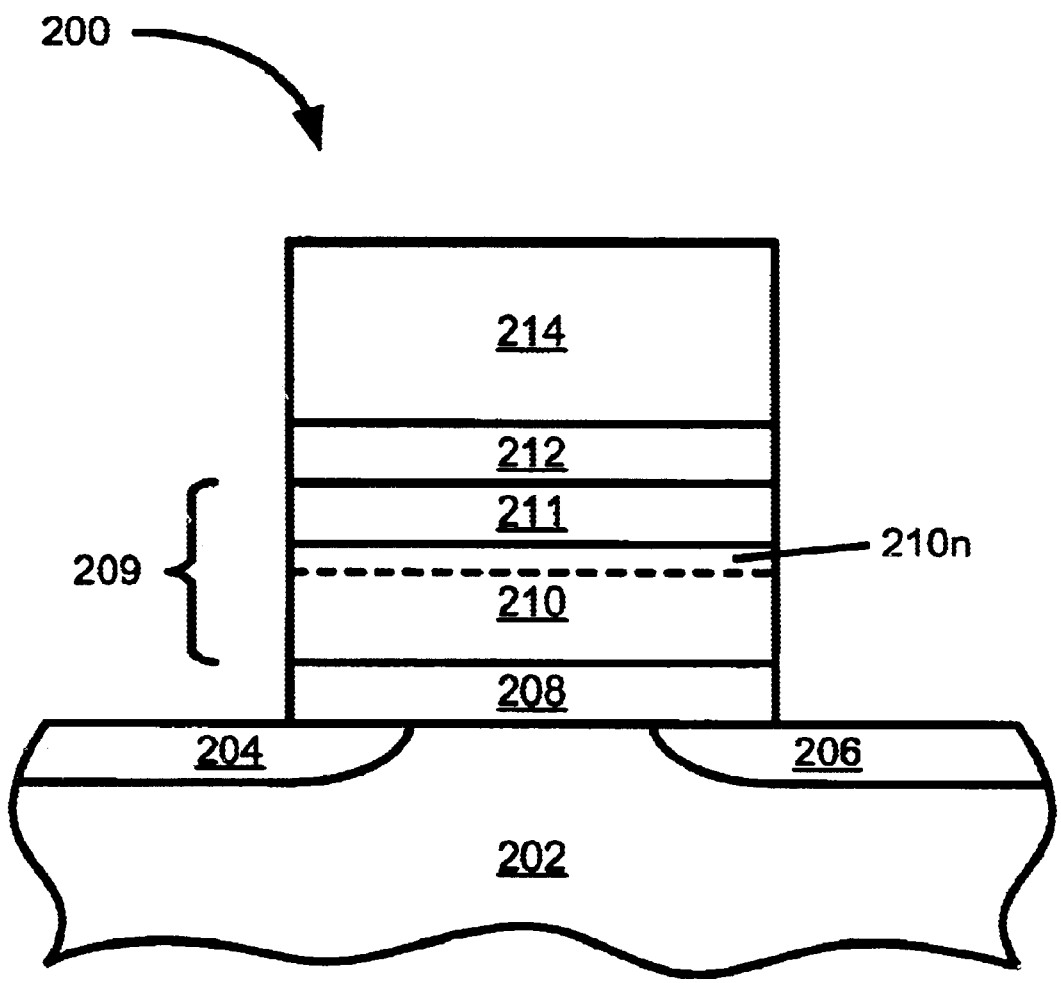
FIG. 2 is a schematic cross-sectional view of a MOSFET transistor according to one embodiment of the present invention.

As shown in FIG. 2, a MOSFET transistor 200 includes therein any suitable semiconductor substrate 202. In one embodiment, substrate 202 is any suitable semiconductor substrate, such as a silicon substrate or a p-type doped silicon substrate. The substrate 202 of MOSFET 200 includes a source region 204, a drain region 206 and a gate stack. In the embodiment, where the substrate is a p-type doped silicon substrate, the source region 204 and drain region 206 are doped to be n-type.

The gate stack contains a tunnel oxide layer 208 formed from, for example, silicon dioxide, a floating gate 209, an insulating layer 212 formed from a suitable high-K material and a control gate 214 formed from polysilicon. The floating gate 209 comprises three layers, an n-type polysilicon layer 210, a nitrogenated portion 210n (which is a portion of n-type polysilicon layer 210) and a p-type polysilicon layer 211. Forming floating gate 209 of an n-type polysilicon layer 210, a nitrogenated portion 210n, and a p-type polysilicon layer 211 permits a better matching of work functions between the p-type polysilicon layer 211 and the high-K insulating layer 212. This in turn permits the use of a broader range of high-K materials for the insulating layer 212, which can lead to improved device functioning and reliability.

Turning to FIGS. 3 to 6, some of the process steps used to create MOSFET 200 of FIG. 2 will be described. As is noted above, in one embodiment semiconductor substrate 202 is a p-type doped silicon substrate. Semiconductor substrate 202 has an upper surface previously processed to remove debris and native oxides.

Figure 3:
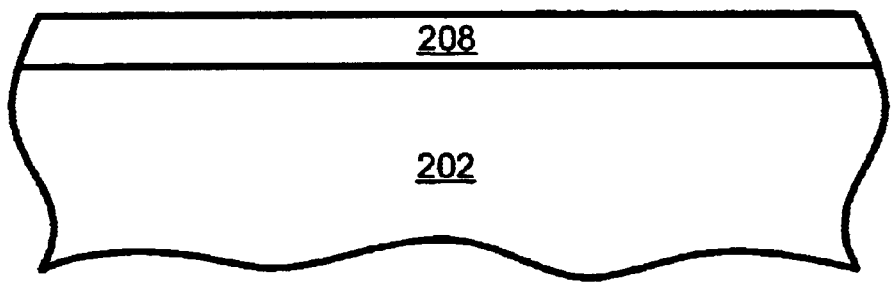
FIGS. 3 to 6 illustrate, in cross-section, some of the process steps for the fabrication of a MOSFET transistor according to one embodiment of the present invention.

As shown in FIG. 3, a tunnel oxide layer 208 is formed by thermally oxidizing the surface of substrate 202 at an elevated temperature in the presence of dry molecular oxygen. In one embodiment, the oxidation process is carried out at a temperature of about 600 to about 1100° C., or event about 900 to about 1100° C. The oxidation process forms a tunnel oxide layer 208 having a thickness of about 30 to about 100 Angstroms, or a thickness of about 40 to about 75 Angstroms, or even a thickness of about 50 Angstroms. The oxidation process can be carried out in either a batch-type thermal oxidation furnace, or alternatively, in a single-wafer oxidation apparatus.

Alternatively, tunnel oxide layer 208 could be any suitable dielectric, be it a standard-K or high-K dielectric layer. As would be appreciated by those of skill in the art, the thickness of tunnel oxide layer 208 may need to be raised or lowered depending on the nature of the material used to form layer 208. If used therein, any high-K material having a K higher than 10, or even higher than 20, can be used in the present invention to form tunnel oxide layer 208. Examples of suitable compounds are discussed above and are shown in Table 1.

In another embodiment, tunnel oxide layer 208 is formed from silicon dioxide and is deposited using any suitable CVD (chemical vapor deposition) process. Such processes include any appropriate CVD method known in the art. For example, the CVD method may be atomic layer deposition (ALD), plasma enhanced CVD (PECVD), low pressure CVD (LPCVD), atmospheric pressure CVD (APCVD), rapid-thermal CVD (RTCVD) or molecular layer doping (MLD).

Figure 4:
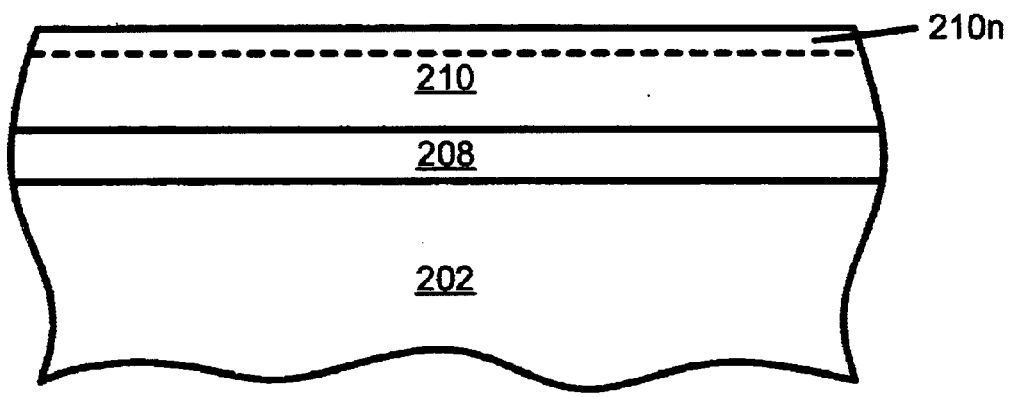

Turning to FIG. 4, an n-type polysilicon layer 210 is formed on the tunnel oxide layer 208 using conventional CVD or PECVD techniques to a thickness of about 900 to about 1,100 Angstroms. N-type polysilicon layer 210 an be formed via an in-situ process or a polysilicon layer can be formed and the doped in a separate step. Suitable n-type impurities include, but are not limited to, antimony, phosphorous or arsenic.

After forming the n-type polysilicon layer 210, a nitridation process is carried out to transform the upper portion of the n-type polysilicon layer 210 into a nitrogenated n-type polysilicon layer 210n. This portion of layer 210 is shown as layer 210n. The nitridation process is preferably carried out by annealing the structure of FIG. 4 in a nitrogen-containing gas atmosphere. In one embodiment, gases such as ammonia, nitrogen oxide (NO), and nitrous oxide can be introduced into a batch-type thermal annealing furnace. An annealing process is then carried out at a temperature of about 600° C. to about 1100° C. for about 10 to about 180 seconds. The annealing process transforms n-type polysilicon layer 210 into an n-type polysilicon layer having a nitrogenated portion 210n and a non-nitrogenated portion 210. The nitrogenated portion of layer 210, portion 210n, has a nitrogen concentration of about 0.1 atomic percent to about 10 atomic percent.

In an alternative embodiment, the nitrogenation process is carried out in an RTCVD apparatus. The same nitrogen-containing gases can be used in both the RTCVD process and the batch type furnace annealing process.

In one embodiment, layer 210n is formed so as to have any suitable thickness. In another embodiment, layer 210n has a thickness of from about 10 to about 200 Angstroms, or from about 15 to about 150 Angstroms, or even from about 25 to about 100 Angstroms.

Figure 5:
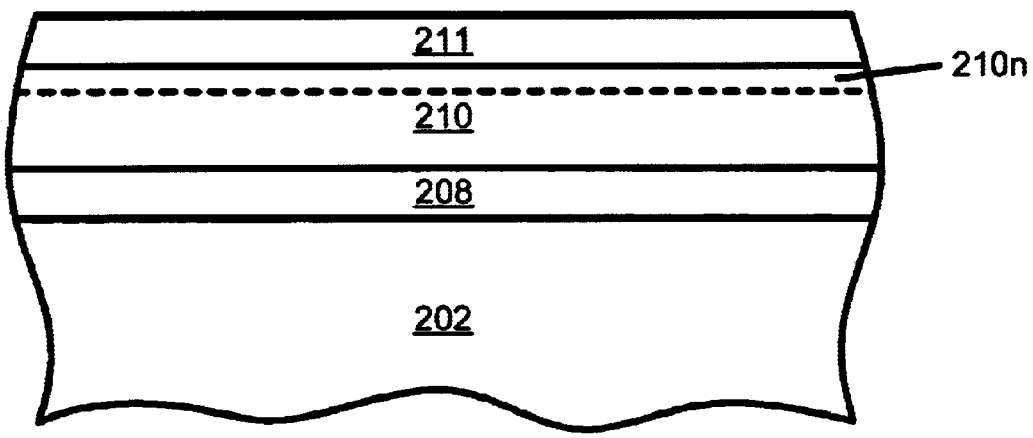

Next, as shown in FIG. 5, a p-type polysilicon layer 211 is formed on top of the n-type polysilicon layer 210 using conventional CVD or PECVD techniques to a thickness of about 250 to about 550 Angstroms, or about 300 to about 500 Angstroms, or even about 400 Angstroms. P-type polysilicon layer 211 can be formed via an in-situ process or a polysilicon layer can be formed and then doped in a separate step. Suitable p-type impurities include boron, gallium or indium.

After formation of the p-type polysilicon layer 211 is complete, the structure of FIG. 5 is subjected to annealing at, for example, a temperature of about 600° C. to about 1100° C. for about 10 to about 180 seconds.

Next an insulating layer 212 formed from a suitable high-K material is deposited on top of the p-type polysilicon layer 211. Again, any high-K material which having a K higher than 10, or even higher than 20, can be used in the present invention. Examples of suitable compounds for the high-K layer 212 are discussed above and are shown in Table 1. In one embodiment, high-K layer 212 is formed of aluminum oxide ($Al_2O_3$).

High-K insulating layer 212 is formed by a suitable CVD process. Such processes include any appropriate CVD method known in the art. For example, the CVD method may be atomic layer deposition (ALD), plasma enhanced CVD (PECVD), low pressure CVD (LPCVD), atmospheric pressure CVD (APCVD), rapid-thermal CVD (RTCVD) or molecular layer doping (MLD).

In one embodiment, high-K insulating layer 212 is formed to have a thickness of about 10 to about 200 Angstroms, or from about 15 to about 150 Angstroms, or even from about 25 to about 100 Angstroms.

Figure 6:
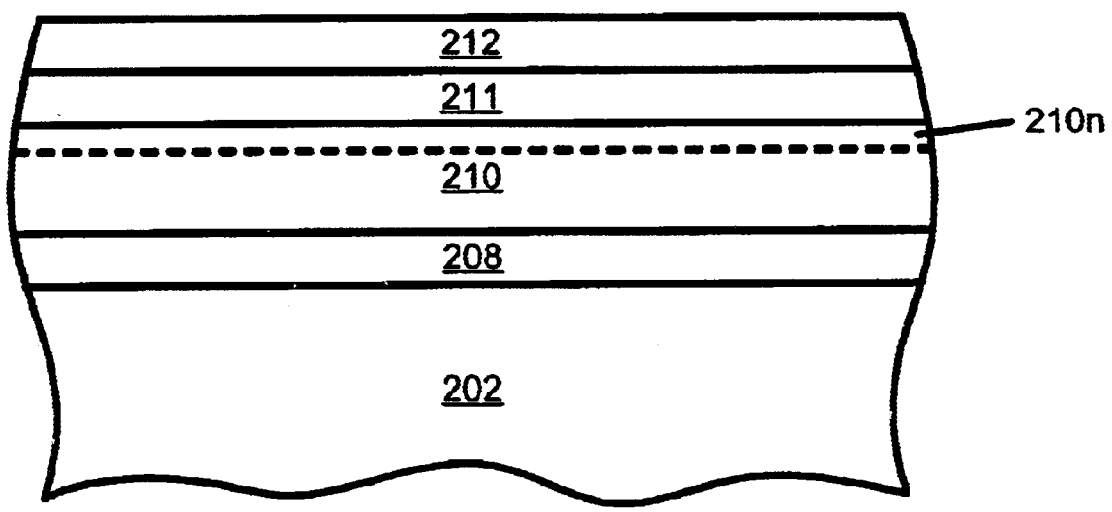

Once the formation of insulating layer 212 is complete, the structure of FIG. 6 is subjected to further processing steps, as are known in the art, to form/deposit the control gate 214, the source region 204, and the drain region 206, to yield MOSFET structure 200 of FIG. 2. As noted above, the present invention is not just limited to MOSFET structures. Rather, the present invention can be utilized in any device which presently incorporate an n-type polysilicon layer with a high-K layer formed on the polysilicon layer. Due to the present invention, an improved work function differential is achieved between the high-K insulating layer and the p-type polysilicon layer while still maintaining the functionality of the n-type polysilicon layer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method of making a gate stack semiconductor device comprising the steps of:

forming a tunnel oxide layer over a p-type semiconductor substrate;

forming a floating gate over the tunnel oxide layer by first forming an n-type polysilicon layer and subjecting the n-type polysilicon layer to nitridation, and then forming a p-type polysilicon layer over the nitridated n-type polysilicon layer; and forming a high-K insulating layer over the p-type polysilicon layer, wherein the high-K insulating layer has a K of at least about 10.

2. The method of claim 1, wherein the tunnel oxide layer is formed by thermally oxidizing the semiconductor substrate.

3. The method of claim 1, wherein the tunnel oxide layer is a high-K tunnel oxide layer formed by atomic layer deposition (ALD), plasma enhanced CVD (PECVD), low pressure CVD (LPCVD), atmospheric pressure CVD (APCVD), rapid-thermal CVD (RTCVD) or molecular layer doping (MLD).

4. The method of claim 1, wherein the n-type polysilicon layer is formed using a chemical vapor deposition or plasma enhanced chemical vapor deposition process.

5. The method of claim 1, wherein the n-type polysilicon layer has a thickness in the range of about 900 to about 1,100 Angstroms.

6. The method of claim 1, wherein the nitridation process of the n-type polysilicon layer is accomplished by annealing in a nitrogen-containing gas.

7. The method of claim 6, wherein the nitrogen-containing gas is selected from ammonia, nitrogen oxide, nitrous oxide, or mixtures of two or more thereof.

8. The method of claim 1, wherein the high-K insulating layer has a K of at least about 20.

9. The method of claim 8, wherein the high-K layer insulating layer comprises at least one of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate ($Ba_{1-x}Sr_xTiO_3$) barium strontium oxide ($Ba_{1-x}Sr_xO_3$), $PbTiO_3$, barium titanate, strontium titanate, $PbZrO_3$, PST ($PbSc_xTa_{1-x}O_3$), PZN ($PbZn_xNb_{1-x}O_3$), PZT ($PbZr_xTi_{1-x}O_3$) and PMN ($PbMg_xNb_{1-x}O_3$).

10. A method of making a gate stack semiconductor device comprising the steps of:

forming a tunnel oxide layer over a p-type semiconductor substrate;

forming a floating gate over the tunnel oxide layer by first forming an n-type polysilicon layer and subjecting the n-type polysilicon layer to nitridation, and then forming a p-type polysilicon layer over the nitridated n-type polysilicon layer, wherein the thickness of the p-type polysilicon layer is in the range of about 250 Angstroms to about 550 Angstroms; and forming a high-K insulating layer over the p-type polysilicon layer, wherein the high-K insulating layer has a K of at least about 10.

11. The method of claim 10, wherein the tunnel oxide layer is formed by thermally oxidizing the semiconductor substrate.

12. The method of claim 10, wherein the tunnel oxide layer is a high-K tunnel oxide layer formed by atomic layer deposition (ALD), plasma enhanced CVD (PECVD), low pressure CVD (LPCVD), atmospheric pressure CVD (APCVD), rapid-thermal CVD (RTCVD) or molecular layer doping (MLD).

13. The method of claim 10, wherein the n-type polysilicon layer is formed using a chemical vapor deposition or plasma enhanced chemical vapor deposition process.

14. The method of claim 10, wherein the n-type polysilicon layer has a thickness in the range of about 900 to about 1,100 Angstroms.

15. The method of claim 10, wherein the nitridation process of the n-type polysilicon layer is accomplished by annealing in a nitrogen-containing gas.

16. The method of claim 15, wherein the nitrogen-containing gas is selected from ammonia, nitrogen oxide, nitrous oxide, or mixtures of two or more thereof.

17. The method of claim 10, wherein the high-K insulating layer has a K of at least about 20.

18. The method of claim 17, wherein the high-K layer insulating layer comprises at least one of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate ($Ba_{1-x}Sr_xTiO_3$) barium strontium oxide ($Ba_{1-x}Sr_xO_3$), $PbTiO_3$, barium titanate, strontium titanate, $PbZrO_3$, PST ($PbSc_xTa_{1-x}O_3$), PZN ($PbZn_xNb_{1-x}O_3$), PZT ($PbZr_xTi_{1-x}O_3$) and PMN ($PbMg_xNb_{1-x}O_3$).

19. A semiconductor device having a gate stack structure, the device comprising:

a semiconductor substrate, wherein the semiconductor substrate is a p-type semiconductor substrate;

a tunnel oxide layer formed over the semiconductor substrate;

a floating gate formed over the tunnel oxide layer; the floating gate comprising:

an n-type polysilicon layer formed over the tunnel oxide layer, the n-type polysilicon layer having a nitridated portion opposite the tunnel oxide layer, and a p-type polysilicon layer over the nitridated portion of the n-type polysilicon layer; and a high-K insulating layer formed over the p-type polysilicon layer of the floating gate, wherein the high-K insulating layer has a K of at least about 10.

20. The semiconductor device of claim 19, wherein the high-K insulating layer has a K of at least about 20.

21. The semiconductor device of claim 19, wherein the high-K insulating comprises at least one of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate ($Ba_{1-x}Sr_xTiO_3$) barium strontium oxide ($Ba_{1-x}Sr_xO_3$), $PbTiO_3$, barium titanate, strontium titanate, $PbZrO_3$, PST ($PbSc_xTa_{1-x}O_3$), PZN ($PbZn_xNb_{1-x}O_3$), PZT ($PbZr_xTi_{1-x}O_3$) and PMN ($PbMg_xNb_{1-x}O_3$).

* * * * *